(12) United States Patent
Grop

(10) Patent No.: US 11,841,739 B2
(45) Date of Patent: Dec. 12, 2023

(54) MODULAR SOFTWARE DEFINED ATOMIC CLOCK SYSTEMS AND METHODS THEREOF

(71) Applicant: OROLIA SWITZERLAND S.A., Neuchatel (CH)

(72) Inventor: Serge Grop, Muntschemier (CH)

(73) Assignee: OROLIA SWITZERLAND S.A., Neuchatel (CH)

( * ) Notice: Subject to any disclaimer, the term of this patent is extended or adjusted under 35 U.S.C. 154(b) by 61 days.

(21) Appl. No.: 17/548,140

(22) Filed: Dec. 10, 2021

(65) Prior Publication Data

US 2023/0185328 A1 Jun. 15, 2023

(51) Int. Cl.
*G06F 1/08* (2006.01)
*G05B 19/05* (2006.01)

(52) U.S. Cl.
CPC .............. *G06F 1/08* (2013.01); *G05B 19/05* (2013.01)

(58) Field of Classification Search
CPC ................................ G06F 1/08; G05B 19/05
See application file for complete search history.

(56) References Cited

U.S. PATENT DOCUMENTS

| | | | | |
|---|---|---|---|---|
| 8,713,331 B2 * | 4/2014 | Kitagawa | ............... | G11C 7/222 327/158 |
| 9,766,682 B1 * | 9/2017 | Singh | ...................... | G06F 1/324 |
| 11,067,630 B2 * | 7/2021 | Conklin | ............. | G01R 31/3191 |
| 2010/0321117 A1 * | 12/2010 | Gan | ........................... | G04F 5/14 331/3 |
| 2011/0066874 A1 * | 3/2011 | Shen | .................... | H04W 52/028 713/400 |
| 2013/0021106 A1 * | 1/2013 | Bracmard | ................. | G06F 1/08 331/48 |
| 2016/0112052 A1 * | 4/2016 | Sheafor | .................. | H02M 3/158 331/44 |
| 2016/0170437 A1 * | 6/2016 | Aweya | .................. | H04B 10/071 713/503 |
| 2017/0003708 A1 * | 1/2017 | Migairou | ................... | H03L 7/22 |
| 2020/0292616 A1 * | 9/2020 | Conklin | ............ | G01R 31/31727 |

(Continued)

OTHER PUBLICATIONS

R. Lutwak*, J. Deng, and W. Riley, The Chip-Scale Atomic Clock—Low-Power Physics Package, pp. 1-14, (Year: 2013).*

*Primary Examiner* — Aurel Prifti
(74) *Attorney, Agent, or Firm* — Troutman Pepper Hamilton Sanders LLP (Rochester)

(57) ABSTRACT

A modular programmable software defined atomic clock system includes an oscillator configured to output a periodic, oscillating electrical signal, an atomic clock physics package system, and a programmable logic controller. The atomic clock physics package system is configured to generate a reference signal based on detected electron spin transitions between two hyperfine energy levels in atoms stored in the atomic clock physics package system. The programmable logic controller is coupled to the oscillator and the atomic clock physics package system. The programmable logic controller is configured to: detect an error signal based on the generated reference signal and the periodic, oscillating electrical signal; adjust the periodic, oscillating electrical signal based on the detected error signal; and generate and output one or more output signals in one or more frequencies from the adjusted periodic, oscillating electrical signal.

20 Claims, 5 Drawing Sheets

(56) References Cited

U.S. PATENT DOCUMENTS

| | | | |
|---|---|---|---|
| 2021/0276858 A1* | 9/2021 | Xereas | B81B 7/0087 |
| 2022/0200612 A1* | 6/2022 | Hara | H03L 7/26 |
| 2022/0221588 A1* | 7/2022 | Elgersma | G01S 19/215 |
| 2022/0239461 A1* | 7/2022 | Smith | H04L 7/027 |

* cited by examiner

MODULAR SOFTWARE DEFINED ATOMIC CLOCK SYSTEMS AND METHODS THEREOF

FIELD

This technology generally relates to atomic clocks and, more particularly, to modular programmable or software defined atomic clock systems and methods thereof.

BACKGROUND

A variety of systems, such as communications and aerospace, require frequency references with very high stability and accuracy. Atomic clocks are highly stable and accurate frequency references that utilize the atomic transition of alkali-metal atoms, such as Cesium or the Rubidium atoms, for correcting an output frequency of a local oscillator, to manage its stability. Unfortunately, prior atomic clock designs have been complex processor-controlled systems with limited modularity.

SUMMARY

A modular programmable software defined atomic clock system includes an oscillator, an atomic clock physics package, and a programmable logic controller. The oscillator is configured to output a periodic, oscillating electrical signal at a frequency at a reference signal frequency. The atomic clock physics package system is configured to generate a reference signal frequency based on detected electron spin transitions between two hyperfine energy levels in atoms stored in the atomic clock physics package system. The programmable logic controller is coupled to the oscillator and the atomic clock physics package system, is being clocked directly from an oscillator frequency from the oscillator, and is configured to: detect an error signal based on the generated reference signal and the periodic, oscillating electrical signal; adjust the periodic, oscillating electrical signal based on the detected error signal; and generate and output one or more output signals in one or more frequencies from the adjusted periodic, oscillating electrical signal.

A method of making a modular programmable software defined atomic clock system includes providing an oscillator configured to output a periodic, oscillating electrical signal at a frequency at a reference signal frequency. An atomic clock physics package system is provided and configured to generate a reference signal frequency based on detected electron spin transitions between two hyperfine energy levels in atoms stored in the atomic clock physics package system. A programmable logic controller is coupled to the oscillator and the atomic clock physics package system, wherein the programmable logic controller is being clocked directly from an oscillator frequency from the oscillator and is configured to: detect an error signal based on the generated reference signal and the periodic, oscillating electrical signal; adjust the periodic, oscillating electrical signal based on the detected error signal; and generate and output one or more output signals in one or more frequencies from the adjusted periodic, oscillating electrical signal.

This technology provides a number of advantages including providing a simpler and more effective modular programmable software defined atomic clock system. With examples of this technology, an operator has full control through a field programmable gate array (FPGA) of the modular programmable software defined atomic clock system. Additionally, examples of this technology are highly accurate and provide for a broad range of output frequencies from sub-Hz to 3 GHz via multiple clock outputs.

DETAILED DESCRIPTION

Figure 1:
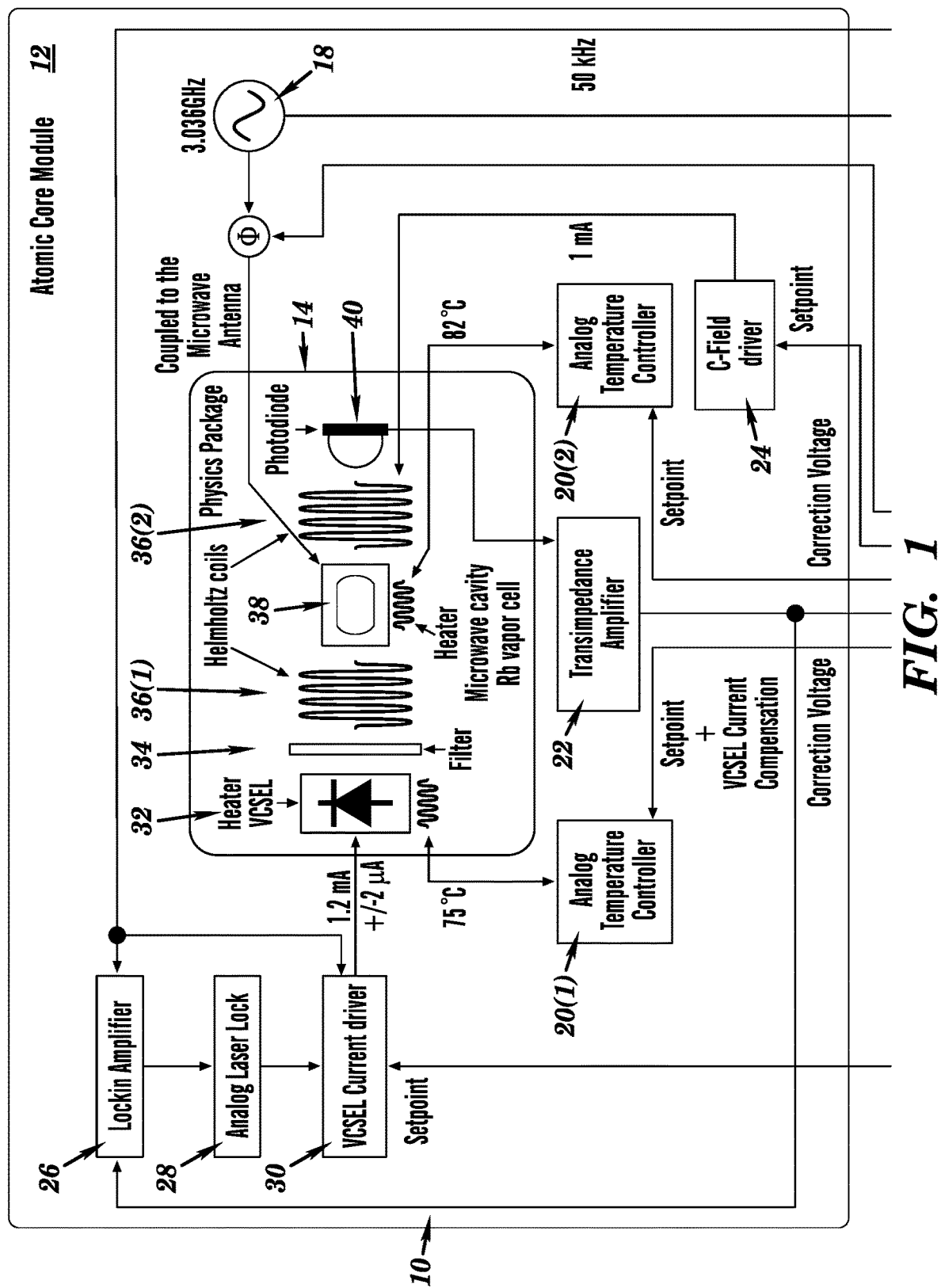
FIG. 1 is a block diagram of an exemplary modular programmable software defined atomic clock system.
Figure 1:
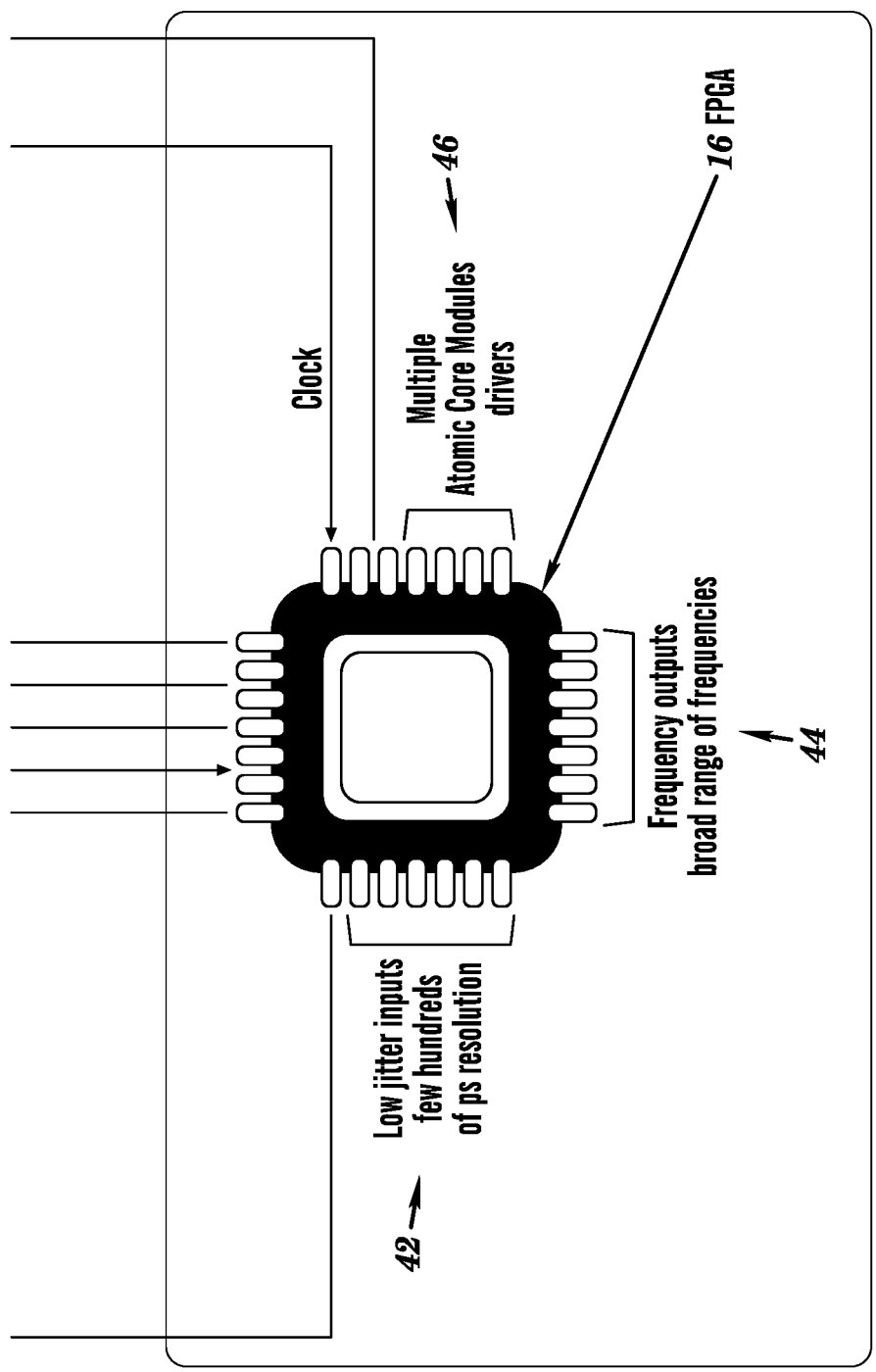

An example of a modular programmable software defined atomic clock system 10 is illustrated in FIG. 1. In this example, the modular programmable software defined atomic clock system 10 includes an atomic core module system 12 with an atomic clock physics package system 14 and a programmable logic controller system 16, although the modular programmable software defined atomic clock system 10 may comprise other types and/or numbers of other systems, devices, components, and/or other elements in other configurations may be used. Examples of this technology provide a number of advantages including providing a simpler and more effective modular programmable software defined atomic clock system.

Referring more specifically to FIG. 1, in this example the atomic core module system 12 includes the atomic clock physics package system 14 along with a oscillator 18, analog temperature controllers 20(1) and 20(2), a transimepdance amplifier 22, a C-field driver 24, a lock-in amplifier 26, an analog laser lock 28, and a Vertical Cavity Surface Emitting Laser (VCSEL) 32, although the system could include other types and/or numbers of systems, devices, components, and/or other elements in other configurations.

The atomic clock physics package system 14 includes a Vertical Cavity Surface Emitting Laser (VCSEL) 32, an optical filter 34, Helmholtz coils 36(1)-36(2) and a microwave cavity vapor cell 38, although the system could include other types and/or numbers of systems, devices, components, and/or other elements in other configurations. In this example, design characteristics of the atomic clock physics package system 14 include low power consumption, small size and mass, along with minimal environmental sensitivities and mechanical ruggedness. Additionally, in this example, all parts of the atomic clock physics package system 14 are incorporated into a DIL-14 package hermetically sealed off under Xenon atmosphere to reduce temperature exchange by convection and minimize electrical power consumption, although other housing configurations could be used.

In the atomic clock physics package system 14, the VCSEL 32 is configured to emit light at 795 nm and is selected for its compactness and low power consumption, although other types of light sources could be used. An optional optical filter 34 may be positioned in the path of the emitted light from the VCSEL 32, although other types and/or numbers of filters may be used.

Figure 3:
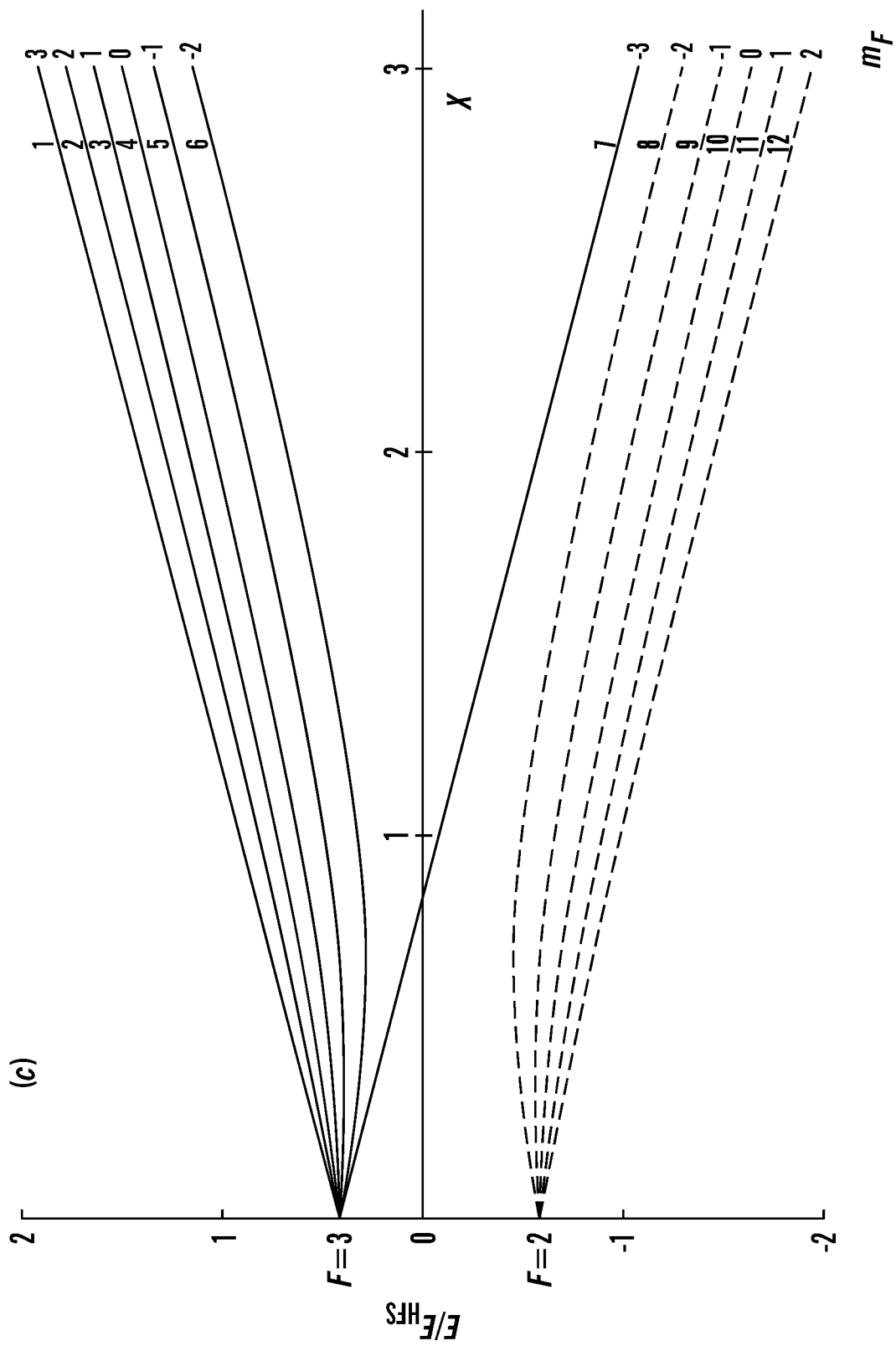
FIG. 3 is a graph illustrating C-field (static magnetic field) splits the Zeeman levels of the 85Rb hyperfine ground-state 5S.

The Helmholtz coils 36(1)-36(2) are positioned in the path of the emitted light from the VCSEL 32 to the photodiode 40 and on opposing sides of the microwave cavity vapor cell 38, although other types and/or number of magnetic field coils in other configurations may be used. In this example, the Helmholtz coils 36(1)-36(2) generate a small axial static magnetic field to resolve Zeeman sub-transitions of a hyperfine line and select a clock transition, i.e. the one with the least magnetic sensitivity. As shown in FIG. 3, the C-field (static magnetic field) provided by the Helmholtz coils 36(1)-36(2) splits the Zeeman levels of a Rubidium 85 (85Rb) hyperfine ground-state 5S. This magnetic field allows fine-tuning of the output frequency by shifting the rubidium 85 resonance frequency by a second-order Zeeman effect. The C-field driver 24 is coupled to the Helmholtz coils 36(1)-36(2) and the programmable logic controller system 16 which manages the control of the Helmholtz coils 36(1)-36(2).

Figure 2:
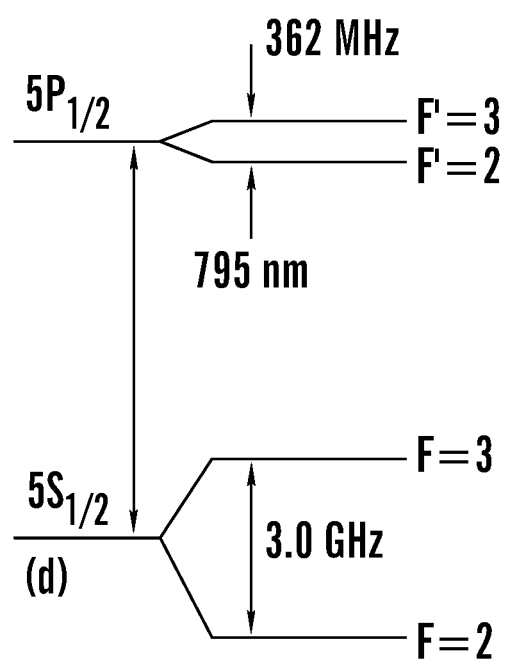
FIG. 2 is a graph illustrating an example of optical pumping of 85Rb atoms.

The microwave cavity vapor cell 38 is a glass blown cell 38 filled with a cavity filled with rubidium 85 atoms and a buffer gas, although other types of cells filled with other types and/or numbers of elements may be used. In this example, the microwave cavity vapor cell 38 is configured to couple the rubidium 85 atoms to a microwave field, transfer heat to the microwave cavity vapor cell 38, and make a thermally stable environment around the microwave cavity vapor cell 38 as an oven. Accordingly, in this example with this transfer of heat, the rubidium 85 atoms are confined in this microwave cavity vapor cell 38 at an elevated temperature. Microwave power derived from the oscillator 18 is coupled to microwave cavity vapor cell 38. The rubidium 85 atoms in the microwave cavity vapor cell 38 occur with equal probability in the two hyperfine energy levels of the ground state 5S (F=2 and F=3) as shown in FIG. 2.

The oscillator 18 is a voltage-controlled crystal oscillator (VCXO) that is locked to a highly stable atomic transition in the ground state of the rubidium 85 isotope in this example, although other types of controlled oscillators may be used. In this example, the oscillator 18 frequency is at 3.036 GHz in the microwave interrogation range of the rubidium 85 atoms, although other frequency ranges can be used. Since the oscillator 18 which is a VCXO in this example is locked to the highly stable atomic transition frequency, it does not have to be a high stability OCXO which has a higher cost and higher power consumption and instead with examples of this technology advantageously can be a lower cost, less power consuming simple VCXO.

The microwave frequency, in this example is at 3.036 GHz, for the oscillator 18 is used to directly clock the programmable logic controller system 16, simplifying the frequency generation circuitry and allowing for simpler more direct controls for the user to create their own programmable frequencies as needed. As a result, with the exemplary configuration direct clocking results in lower phase noise, higher resolution of generated user programmable frequencies, and less circuitry.

The analog temperature controllers 20(1) and 20(2) are coupled to independently monitor and manage the temperature of the VCSEL 32 and the microwave cavity vapor cell 38, respectively, under the control of the programmable logic controller system 16, although other manners for maintaining temperature stability of the VCSEL 32 and the microwave cavity vapor cell 38 as well as other systems, devices, components, and/or other elements may be used. In this example, the analog temperature controllers 20(1) and 20(2) comprise two separated heaters controlled by the programmable logic controller system 16 to independently monitor and manage the temperature of the VCSEL 32 and the microwave cavity vapor cell 38, although other types of temperature adjustment system could be used.

The transimpedance amplifier 22 is a current to voltage converter coupled between the photodiode 40 and the programmable logic controller system 16. In this example, the transimpedance amplifier 22 converts the detected current signal to a voltage signal for the programmable logic controller system 16 that is used to correct and keep the oscillator 18 exactly on the atomic resonance.

The lock-in amplifier 26, the analog laser lock 28, and VCSEL current driver 30 are coupled in series together and also to the programmable logic controller system 16 which provides control signals to manage the operation of the VCSEL 32 as illustrated and described by way of the examples herein.

The programmable logic controller system 16 in this example comprises a field programmable gate array (FPGA) in this example which is configured to perform a number of functions and/or other operations as illustrated and described by way of the examples herein. By way of example, the programmable logic controller system 16 is configured to manage the microwave generation by the controlled oscillator 18, monitor and manage the detection circuitry comprising the photodiode 40 and transimpedance amplifier 22, monitor and manage the temperature controllers 20(1)-20(2), and manage the output one or more stable clock frequency signals at one or more of a broad range of possible frequencies. In this example the programmable logic controller system 16 has low jitter inputs from the atomic core module systems 12 having a few hundredths of picosecond resolution 44, a plurality of frequency outputs over a broad range of programmed frequencies based on the stabilized atomic clock signal, and atomic core module driver outputs 46 for one or more of the atomic core module systems 12, although the programmable logic controller system 16 could have other types and/or numbers of other inputs and/or outputs.

Figure 5:
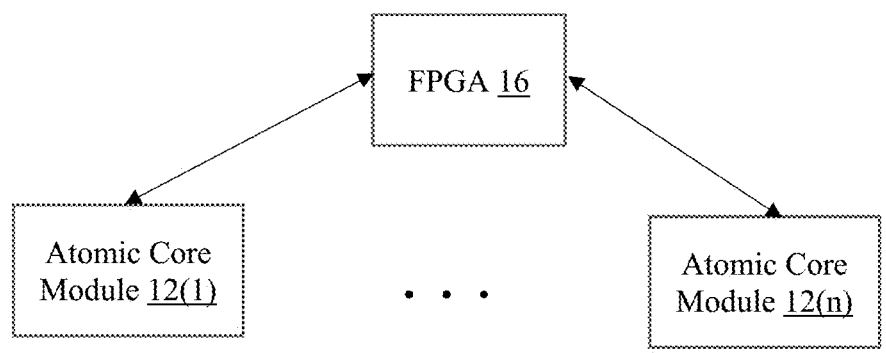
FIG. 5 is a block diagram of an exemplary modular programmable software defined atomic clock system with a programmable logic controller system coupled to manage and utilize multiple atomic clock physics package systems.

With this design, as illustrated and described by the examples herein, also allows the use of more than one atomic core modules 12(1)-12(n) to be controlled by a single programmable logic controller system 16. In this example, each of the atomic core modules 12(1)-12n) has the same structure and operation as illustrated and described herein with reference to atomic core module 12, although one or more could have other configurations. The single programmable logic controller system 16 can use a combination of the reference frequencies provided by the atomic core modules 12(1)-12(n) to control multiple oscillators 18 in each as shown in FIG. 5. This ability to have multiple references can increase reliability by providing redundant reference sources or provide higher accuracy by statistically combining the reference sources, or can be used for both purposes.

Another use case for multiple atomic core modules 12 is that one core module 12(1) can serve as a reference and other core modules 12(2)-12(n) can be used as sensors to compare differences in temperature, magnetic field or laser light source behavior by way of example.

Exemplary methods for using the modular programmable software defined atomic clock system 10 will now be described by way of various examples with reference to FIGS. 1-4. In this example, rubidium 85 atoms are confined in the microwave cavity vapor cell 38 at an elevated temperature managed by the analog temperature controllers 20(1) and 20(2) under the control. Microwave power derived from the controlled oscillator 18 is coupled to the microwave cavity vapor cell 38. In this example, the rubidium 85 atoms in the microwave cavity vapor cell 38 occur with equal probability in two hyperfine energy levels of the ground state 5S (F=2 and F=3) as illustrated in FIG. 2.

In order to detect a clock transition between these two levels, the rubidium 85 atoms in the microwave cavity vapor cell 38 need to be manipulated in such a way that most of them occur in only one level. This is done by optical pumping via a higher lying state (5P) with the VCSEL 38 which is under the control of the lock-in amplifier 26, the analog laser lock 28, the VCSEL current driver 30 and control signals from the FPGA. Atomic energy levels and transitions involved in the optical pumping process on the D1-line at 795 nm are illustrated in FIG. 2.

As discussed above, the pumping light comes from the VCSEL 32 under the control of the programmable logic controller system 16 which is tuned to resonance with the transition between the ground-state F=3 level and the (unresolved) excited states F'=2, 3. The pump light excites rubidium 85 atoms which are in the upper hyperfine level (F=3) to the short-lived excited state 5P from which they decay to the two ground state levels (F=2, 3) with equal probability. Since pumping occurs continuously out of the F=3 level, a steady-state is reached where most atoms are found in the F=2 level.

The level of the transmitted pump light from the VCSEL 32 to the microwave cavity vapor cell 38 is detected by a photodiode 40 positioned after the microwave cavity vapor cell 38. When a microwave field resonant with the clock transition F=2*F=3 is coupled to the interaction region, the level F=3 is repopulated and light absorption is enhanced. A sweep of the microwave field over the resonance is detected as a small dip in the transmitted light level after the microwave cavity vapor cell 38. Frequency variations of the microwave signal from the oscillator 18 are transformed into DC current changes at the photodiode 40.

This detected current signal from the photodiode 40 is fed into the transimpedance amplifier 22 which converts the detected current signal to a voltage signal for the programmable logic controller system 16. The programmable logic controller system 16 is configured as a synchronous detector whose output generates an error signal from the voltage signal that is used to correct and keep the oscillator 18 exactly on the atomic resonance.

Figure 4:
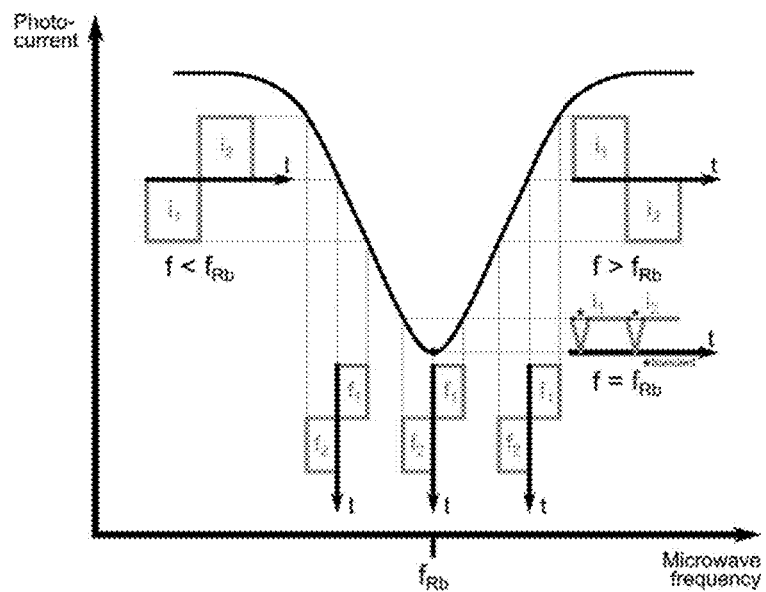
FIG. 4 is a graph of an example of error signal detection with the exemplary modular programmable software defined atomic clock system.

A graph of an example of error signal detection by the programmable logic controller system 16 of the exemplary modular programmable software defined atomic clock system 10 is shown in FIG. 4. In this example, the modulated microwave frequency flips between two discrete frequency values f1 and f2. The resulting photo-current i(t) detected by the photodiode 40 appears also (after the transient) at two discrete values i1 and i2. The difference between i1 and i2 produces the error signal used by the programmable logic controller system 16 to adjust the crystal oscillator center frequency of oscillator 18 until the mean value of f1 and f2 is exactly equal to the rubidium hyperfine frequency.

Accordingly, as illustrated and described by way of the examples herein, the modular programmable software defined atomic clock system creates and maintains an accurate and stable atomic clock reference signal in which no processor is integrated. With examples of this technology, an operator has full control through a field programmable gate array (FPGA) of the modular programmable software defined atomic clock system. Additionally, examples of this technology are highly accurate and are able to provide a broad range of output frequencies from sub-Hz to 3 GHz via multiple clock outputs. Further, with the control algorithms for temperature control, magnetic C-field control, and the VCSEL light source control all contained in the FPGA 16, the user has access to these algorithms and can adjust their response to optimize for their own particular application.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A modular programmable software defined atomic clock system comprising:
    an oscillator configured to output a periodic, oscillating electrical signal at a frequency at a reference signal frequency;
    an atomic clock physics package system configured to generate a reference signal frequency based on detected electron spin transitions between two hyperfine energy levels in atoms stored in the atomic clock physics package system; and
    a programmable logic controller coupled to the oscillator and the atomic clock physics package system, wherein the programmable logic controller is being clocked directly from an oscillator frequency from the oscillator and is configured to:
        detect an error signal based on the generated reference signal and the periodic, oscillating electrical signal;
        adjust the periodic, oscillating electrical signal based on the detected error signal; and
        generate and output one or more output signals in one or more frequencies from the adjusted periodic, oscillating electrical signal.

2. The system as set forth in claim 1 further comprising:
    one or more control systems coupled to one or more atomic clock physics package systems,
    wherein the programmable logic controller is configured to:
        adjust the oscillator frequency based on a combination of the one or more generated reference signals from the one or more atomic clock physics package systems.

3. The system as set forth in claim 2 wherein the one or more control systems further comprise:
    one or more analog temperature controllers which are coupled to at least one of field coils or a light source in the atomic clock physics package system;
    wherein the adjust the operation of the one or more analog temperature controllers further comprises modifying an operating temperature of at least one the field coils or a light source.

4. The system as set forth in claim 2 wherein the one or more atomic clock physics package systems further comprise two or more of the atomic clock physics package systems and wherein two or more temperature control systems are configured as sensors to sense a difference in operating temperature of one or more of the atomic clock physics packages from another one of the one or more of the atomic clock physics packages that acts as a first reference.

5. The system as set forth in claim 2 wherein the one or more control systems further comprise:
one or more magnetic control systems comprising field drivers which are coupled to field coils in the atomic clock physics package system;
wherein the adjust the operation of the one or more field drivers further comprises modifying a magnetic field generated by the field coils.

6. The system as set forth in claim 2 wherein the one or more atomic clock physics package systems further comprise two or more of the atomic clock physics package systems and wherein two or more magnetic field control systems are configured as sensors to sense a difference in a magnetic field of one or more of the atomic clock physics package from another one of the atomic clock physics packages that acts as a first reference.

7. The system as set forth in claim 2 wherein the one or more control systems further comprise:
one or more light source controllers which are coupled to a light source in the atomic clock physics package system;
wherein the adjust the operation of the one or more light source controllers further comprises modifying light emitted by the light source.

8. The system as set forth in claim 2 wherein the one or more atomic clock physics package systems further comprise two or more of the atomic clock physics package systems and wherein two or more light source controllers are configured as sensors to sense a difference in light source of one or more of the atomic clock physics packages from another one of the atomic clock physics packages that acts as a first reference.

9. The system as set forth in claim 1 wherein the programmable logic controller is coupled to two or more different ones of the oscillator and the atomic clock physics package system.

10. The system as set forth in claim 1 wherein the oscillator comprises a voltage controlled crystal oscillator.

11. A method of making a modular programmable software defined atomic clock system, the method comprising:
providing an oscillator configured to output a periodic, oscillating electrical signal at a frequency at a reference signal frequency;
providing an atomic clock physics package system configured to generate a reference signal frequency based on detected electron spin transitions between two hyperfine energy levels in atoms stored in the atomic clock physics package system; and
coupling a programmable logic controller to the oscillator and the atomic clock physics package system, wherein the programmable logic controller is being clocked directly from an oscillator frequency from the oscillator and is configured to:
detect an error signal based on the generated reference signal and the periodic, oscillating electrical signal;
adjust the periodic, oscillating electrical signal based on the detected error signal; and
generate and output one or more output signals in one or more frequencies from the adjusted periodic, oscillating electrical signal.

12. The method as set forth in claim 11 further comprising:
coupling one or more control systems to one or more atomic clock physics package systems,
wherein the programmable logic controller is configured to:
adjust the oscillator frequency based on a combination of the one or more generated reference signals from the one or more atomic clock physics package systems.

13. The method as set forth in claim 12 wherein the one or more control systems further comprise:
one or more analog temperature controllers which are coupled to at least one of field coils or a light source in the atomic clock physics package system;
wherein the adjust the operation of the one or more analog temperature controllers further comprises modifying an operating temperature of at least one the field coils or a light source.

14. The method as set forth in claim 12 wherein the one or more atomic clock physics package systems further comprise two or more of the atomic clock physics package systems and wherein two or more temperature control systems are configured as sensors to sense a difference in operating temperature of one or more of the atomic clock physics packages from another one of the one or more of the atomic clock physics packages that acts as a first reference.

15. The method as set forth in claim 12 wherein the one or more control systems further comprise:
one or more magnetic control systems comprising field drivers which are coupled to field coils in the atomic clock physics package system;
wherein the adjust the operation of the one or more field drivers further comprises modifying a magnetic field generated by the field coils.

16. The method as set forth in claim 12 wherein the one or more atomic clock physics package systems further comprise two or more of the atomic clock physics package systems and wherein two or more magnetic field control systems are configured as sensors to sense a difference in a magnetic field of one or more of the atomic clock physics package from another one of the atomic clock physics packages that acts as a first reference.

17. The method as set forth in claim 12 wherein the one or more control systems further comprise:
one or more light source controllers which are coupled to a light source in the atomic clock physics package system;
wherein the adjust the operation of the one or more light source controllers further comprises modifying light emitted by the light source.

18. The method as set forth in claim 12 wherein the one or more atomic clock physics package systems further comprise two or more of the atomic clock physics package systems and wherein two or more light source controllers are configured as sensors to sense a difference in light source of one or more of the atomic clock physics packages from another one of the atomic clock physics packages that acts as a first reference.

19. The method as set forth in claim 11 wherein the programmable logic controller is coupled to two or more different ones of the oscillator and the atomic clock physics package system.

20. The method as set forth in claim 11 wherein the oscillator comprises a voltage controlled crystal oscillator.

* * * * *